United States Patent
Nakao

[11] Patent Number: 5,874,761
[45] Date of Patent: Feb. 23, 1999

[54] SEMICONDUCTOR MEMORY DEVICE WITH THREE-DIMENSIONAL CLUSTER DISTRIBUTION

[75] Inventor: Hironobu Nakao, Kyoto, Japan

[73] Assignee: Rohm Co., Ltd., Kyoto, Japan

[21] Appl. No.: 962,322

[22] Filed: Oct. 15, 1992

[30] Foreign Application Priority Data

Oct. 30, 1991  [JP]  Japan .................................. 3-284551

[51] Int. Cl.⁶ .......................... G11C 11/34; H01L 29/78
[52] U.S. Cl. ............................................. 257/325; 257/324
[58] Field of Search .................................. 257/325, 324, 257/314; 437/35; 438/257

[56] References Cited

U.S. PATENT DOCUMENTS

| | | | |
|---|---|---|---|
| 3,805,130 | 4/1974 | Yamazaki ................................ | 257/325 |
| 3,878,549 | 4/1975 | Yamazaki et al. ....................... | 257/325 |
| 5,147,811 | 9/1992 | Sakagami .................................. | 437/35 |

FOREIGN PATENT DOCUMENTS 58-194369  11/1983  Japan ...................................... 257/324

OTHER PUBLICATIONS

Chan et al., "A True Single–Transistor Oxide–Nitride–Oxide EEPROM Device", *IEEE Electron Device Letters,* vol. EDL–8, No. 3, Mar. 1987, pp. 93–95.

*Primary Examiner*—Tom Thomas
*Assistant Examiner*—Alexander Oscar Williams
*Attorney, Agent, or Firm*—Baker & Botts, L.L.P.

[57] ABSTRACT

A method of producing a semiconductor memory device forms an overlap between a distribution of semiconductor clusters in a gate insulating layer and a drain region by oblique ion implantation using the edge of the semiconductor cluster distribution as a self-align mask. At least a portion of the semiconductor cluster distribution which is the nearest to the Si substrate and the drain overlaps a drain diffusion layer, and the semiconductor clusters are overlapped with each other. Thus, the device has a 1Tr/cell structure. As a result, the properties of a nonvolatile memory device using an insulating film are improved.

1 Claim, 2 Drawing Sheets

SEMICONDUCTOR MEMORY DEVICE WITH THREE-DIMENSIONAL CLUSTER DISTRIBUTION

BACKGROUND OF THE INVENTION

The present invention relates to a semiconductor memory device and a method of producing the same and, more specifically, relates to a nonvolatile memory device, for example, a flash EEPROM (flash electrically erasable programmable read-only memory), in which an insulating film containing metal or semiconductor particles is used in a gate of a transistor.

Conventionally, in an MOS-type transistor used to store information, a semiconductor memory device has been proposed in which a portion containing conductive silicon clusters in insulating silicon is disposed above the channel area but below the control gate electrode.

One such conventional semiconductor memory device, shown in FIG. 6, comprises an n-channel transistor, a source region 13 and a drain region 12 of n-type semiconductor material, an Si substrate 11 which is a p-type semiconductor, and a gate region including a polysilicon layer 16 and an insulating region having two oxide layers 14 and a nitride layer 15 disposed between the oxide layers 14. When electrons are injected into the insulating region adjacent to the channel layer in the substrate during operation, this raises the gate threshold voltage which is necessary to render the channel layer conductive and, when electrons are withdrawn from semiconductive silicon clusters, the gate threshold voltage is reduced. In this way, the device can be arranged to retain data by applying a gate sensing voltage which is between the threshold values in the initial state and in the electron-injected state so as to give an on-off control to the transistor.

This operation is specifically described in the article entitled "A True Single-Transistor Oxide-Nitride-Oxide EEPROM Device" (IEEE Electron Device Letters, Vol. EDL-8, No. 4, March 1987). In this operation, data writing is normally carried out by electron injection, while data erasing is carried out by hole injection. After 40,000 write/erase cycles, the erased state and storage-state characteristics are degraded. In order to eliminate such drawbacks, this article proposes that the stored charges representing data be withdrawn into the drain region by tunneling. However, it is difficult for electrons to flow in a lateral direction in the nitride layer.

In conventional data storage devices, each memory cell must be made of only one transistor (1Tr/cell) to provide high-density integration. However, the method of integration of such devices has not been resolved and the removal of electrons from the drain region and the injection of electrons into the drain region have not yet been accomplished effectively.

SUMMARY OF THE INVENTION

An object of the invention is to provide a semiconductor memory device and a method for making such a device by which improved quality can be provided.

In order to realize the above-mentioned object, the present invention provides a method of producing a semiconductor memory device comprising the steps of distributing clusters of semiconductor material throughout an insulating film layer which has a predetermined thickness and is formed on an Si substrate, forming a gate electrode on the upper portion of the insulating film layer, and forming a source electrode and a drain electrode in spaced relation below the insulating film layer, wherein impurities used to form the drain electrode are obliquely injected into the Si substrate under the insulating film layer from above by an oblique ion implantation so that the drain electrode extends under the insulating film layer.

Since one transistor per one cell (1Tr/cell) can be realized in the semiconductor memory device according to the present invention, the integration density can be increased. If there is a pinhole in an $SiO_2$ film between a trap film and a substrate, this can cause leakage of the electrons. However, in this invention, since the clusters of semiconductor material are distributed throughout the layer, even if one pinhole exists, leakage does not occur in the entire channel. The possibility of such pinhole leakage is decreased if the area of the channel is smaller. Furthermore, because the clusters of semiconductor material are dispersed, the region containing the clusters will be overlapped with the drain. Therefore, the memory device is stable and local rewriting does not cause over-erasing.

DETAILED DESCRIPTION OF PREFERRED EMBODIMENTS

The embodiment according to the present invention will be described in detail hereinafter with reference to the accompanying drawings.

Figure 1:
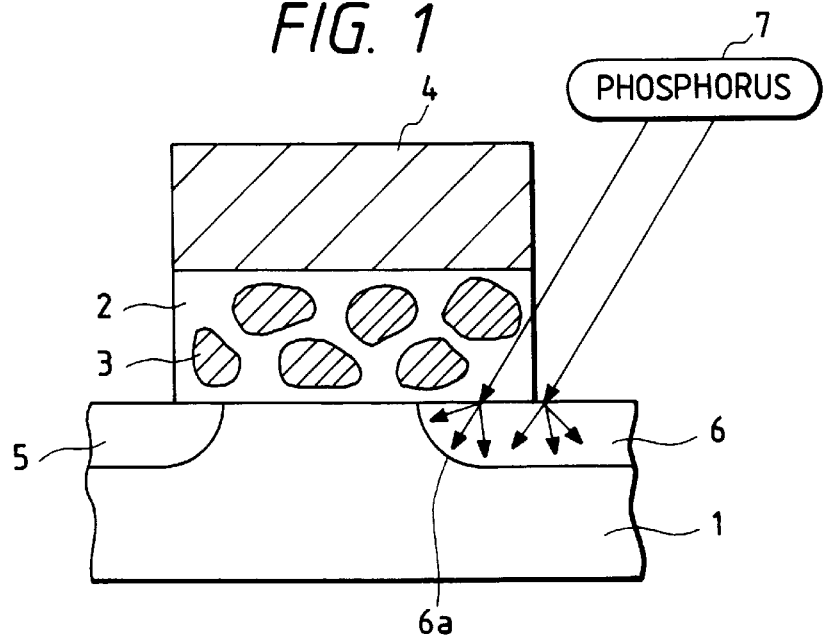
FIG. 1 is a cross-sectional view showing a process for the manufacture of a semiconductor memory device of the present invention.

FIG. 1 shows a nonvolatile memory comprising an Si substrate 1, an insulating film layer 2 having a predetermined thickness throughout which clusters of a semiconductor material 3 are distributed in three dimensions, a gate region 4 formed on the upper portion of the insulating layer 2, and a source region 5 and a drain region 6 which are spaced from each other in the substrate 1 beneath the insulating film layer 2. The impurities used to form the drain region 6 in the Si substrate 1 are obliquely injected under the insulating film layer from above the Si substrate by an oblique ion implantation. Thus, the drain region 6 is formed so as to extend under the insulating film layer in a region 6a. That is, the drain region 6 is overlapped with the insulating film layer.

Accordingly, in the production method of the present invention, the overlapping is caused by the oblique ion implantation using the edge of the distribution of semiconductor clusters 3 as a self-align mask. The structure of the resulting semiconductor memory device is arranged so that the portion of the gate layer having semiconductor clusters nearest to the substrate and to the drain region is at least partially overlapped through an insulating layer with the drain region. Furthermore, the semiconductor clusters are distributed in three dimensions so as to be overlapped with each other so that each cell can be formed with only one transistor (1Tr/cell).

In the above-mentioned structure, an $SiO_2$ film can be inserted either above or beneath a semiconductor cluster-type trap film or both above and beneath the film so that the distances between the clusters and the substrate and the gate electrode are each 50 Å or more.

Figure 2:
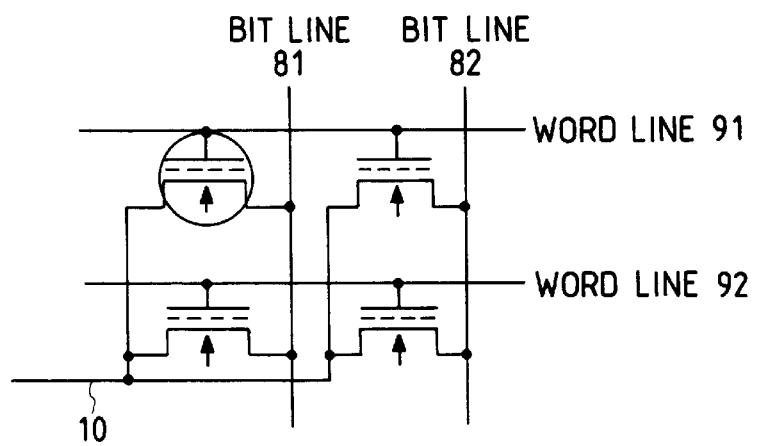
FIG. 2 is a memory matrix circuit diagram using the semiconductor memory device of FIG. 1.
Figure 3:
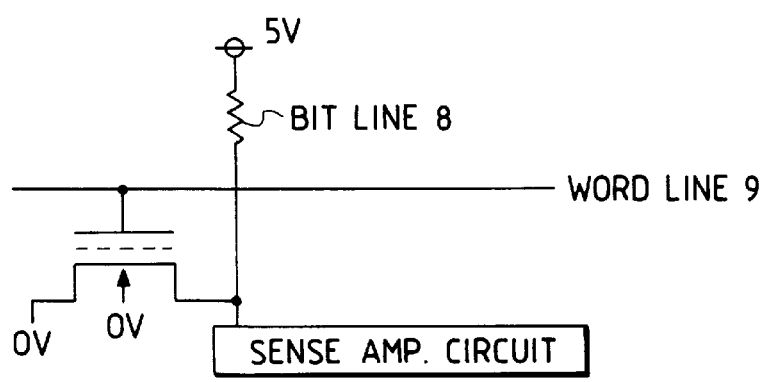
FIG. 3 is a circuit diagram showing the external connections for the circuit of FIG. 2.

As shown in FIG. 2, gate lines and drain lines from each semiconductor device of the type described are arranged to form a matrix circuit. As shown in FIG. 3, a sense amplifier is connected to the matrix circuit to withdraw electrons from a location near the drain region by DAHE (drain avalanche hot electron) or CHE, and the electrons are transferred to the drain by F-N tunneling. The operating voltages for writing, erasing and reading in the bit line, word line, source line and the substrate electrode of the matrix circuit shown in FIG. 2 are set forth in the following Table 1.

TABLE 1

|  | bit line 1 | bit line 2 | word line 1 | word line 2 | source line | substrate potential |
|---|---|---|---|---|---|---|
| writing | 13 V | 0 V | 13 V | 0 V | 0 V | 0 V |
| erasing | 5 V | 5 V | −7 V | −7 V | OPEN | 0 V |
| reading |  | 0 V | 5 V | 0 V | 0 V | 0 V |

Figure 4:
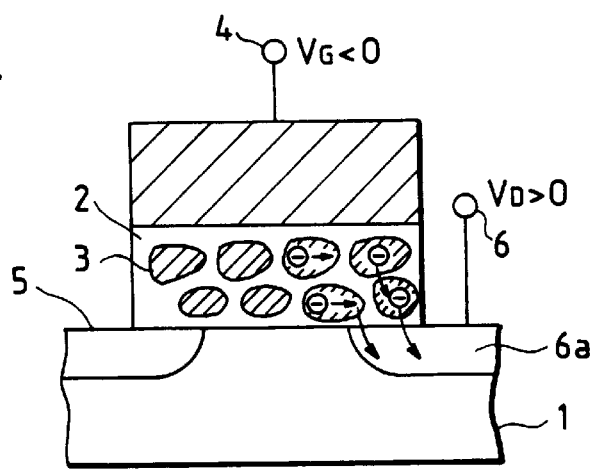
FIG. 4 is a cross-sectional view showing the transfer of charge from the gate into the drain of the semiconductor memory device of FIG. 1.
Figure 5:
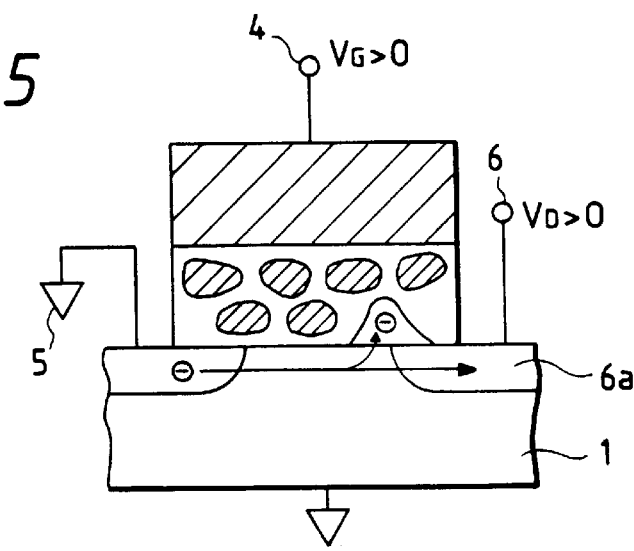
FIG. 5 is a cross-sectional view showing charge injection into the gate at the drain of the semiconductor memory device of FIG. 1.
Figure 6:
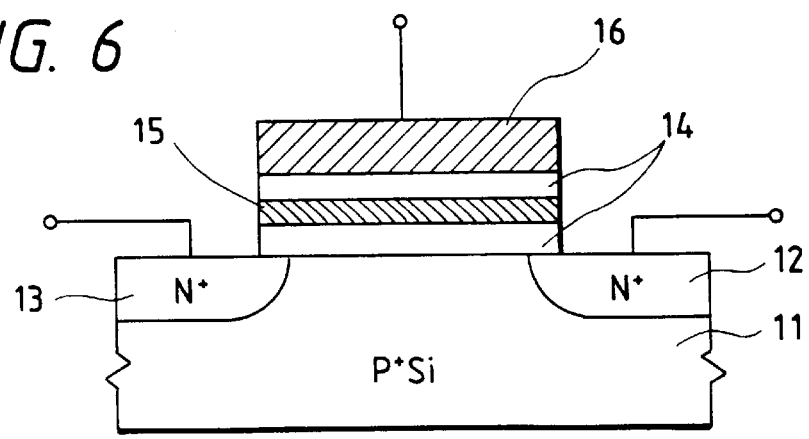
FIG. 6 is a cross-sectional view of a conventional semiconductor memory device.

During rewriting of data in the matrix circuit shown in FIG. 2 with transfer of electrons as shown in FIG. 5, the gate region and the drain region are connected to a positive voltage, whereas the source region is grounded. As a result, the electrons are injected into the gate insulator near the drain region by CHE or DAHE. Alternatively, when the electrons are withdrawn from the gate insulating region as shown in FIG. 4, the gate region and the drain region are connected to a negative voltage and positive voltage, respectively, and the source is left unconnected. As a result, the electrons are drawn into the drain region by F-N tunneling. Thus, selective injection with 1Tr/cell is carried out in the matrix circuit using the gate line and the drain line, while withdrawal of the electrons is carried out at the same time.

If local injection and withdrawal are not carried out for rewriting of data, a 1Tr/cell arrangement cannot be realized. That is, if the complete injection is carried out, electron injection occurs at all transistors connected with the common gate line because of the voltage applied between substrate and gate. To prevent this disadvantage, the selective transistor is required and the thickness of the $SiO_2$ insulating film must be set at about 20 to 30 Å for writing efficiency. If an $SiO_2$ film has a thickness of 50 Å or more, complete injection or complete withdrawal of electrons do not usually occur. Further, because the clusters extend to a region overlapping with the drain, the removal of electrons into the drain can be carried out by local injection, which easily moves electrons in the lateral plane of the floating gate. In the present invention, the oblique ion implantation is carried out so as to overlap the drain region with the semiconductor cluster distribution.

As described above, in the production method of the present invention, the drain layer is formed by an oblique ion implantation using the edge of the semiconductor cluster distribution as a self-align mask. In this structure, the $SiO_2$ film between the cluster and the substrate is 50 Å or more. Therefore, in the device of the present invention, the edge of the cluster distribution and the drain diffusion layer are overlapped. Furthermore, because of their three-dimensional distribution, each of the clusters is overlapped with other clusters.

As explained above, in the present invention 1Tr/cell can be realized and the integration degree can also be improved. Even if a pinhole exists in an $SiO_2$ film between a trap film and a substrate, which often causes the leakage of the electrons, leakage of electrons from the entire channel can be prevented because the semiconductor material is separated into spaced clusters. The possibility of such leakage is decreased when the area of the channel is smaller. Furthermore, even if the position of the edge of the distributed clusters is irregular, the clusters surely overlap with the drain and there is no excess erasing in local rewriting.

What is claimed is:

1. A semiconductor memory device comprising:

a silicon substrate;

an insulating layer with a predetermined width, in which clusters of semiconductor material are distributed in three dimensions so as to be overlapped in a direction through the layer;

a gate region formed on an upper portion of said insulating layer; and a source region and a drain region formed in spaced relation in the substrate beneath said insulating layer;

wherein said drain region is formed by an oblique ion implantation, and is overlapped with said insulating film layer.

* * * * *